(12) United States Patent
Trapp

(10) Patent No.: US 6,897,120 B2
(45) Date of Patent: May 24, 2005

(54) METHOD OF FORMING INTEGRATED CIRCUITRY AND METHOD OF FORMING SHALLOW TRENCH ISOLATION IN A SEMICONDUCTOR SUBSTRATE

(75) Inventor: Shane J. Trapp, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/920,978

(22) Filed: Aug. 1, 2001

(65) Prior Publication Data

US 2002/0086543 A1 Jul. 4, 2002

Related U.S. Application Data

(63) Continuation-in-part of application No. 09/752,685, filed on Jan. 3, 2001.

(51) Int. Cl.[7] ........................ H01L 21/76; H01L 21/312
(52) U.S. Cl. ....................................... 438/424; 438/714
(58) Field of Search ................................. 438/424, 714

(56) References Cited

U.S. PATENT DOCUMENTS 3,990,927 A 11/1976 Montier ........................... 156/8
4,352,724 A * 10/1982 Sugishima et al. .... 204/192.37
4,474,975 A 10/1984 Clemons et al. ............ 556/410
4,836,887 A * 6/1989 Daubenspeck et al. ..... 156/643
4,985,373 A 1/1991 Levinstein et al.

(Continued)

FOREIGN PATENT DOCUMENTS

JP 9-129608 * 5/1997 ......... H01L/21/302
JP 2000349071 A * 12/2000 ....... H01L/21/3065

OTHER PUBLICATIONS

Stanley Wolf Silicon Processing for the VLSI Era vol. 2 Lattice Press 1990 pp. 52–54.*
Bell Labs Scientists Develop 193 nm Single–Layer Photo-resist Bell Labs News Apr. 1997.*
Stanley Wolf Silicon Processing for the VSLI Era vol. 1 Lattice Press 1986 pp. 551–557.*
U.S. Appl. No. 09/752,685, filed Jan. 3, 2001, Trapp.

(Continued)

Primary Examiner—David S. Blum

(74) Attorney, Agent, or Firm—Wells St. John P.S.

(57) ABSTRACT

A method of forming integrated circuitry includes forming a silicon nitride comprising layer over a semiconductor substrate. At least a portion of the silicon nitride comprising layer is etched using an etching chemistry comprising ammonia and at least one fluorocarbon. A method of forming shallow trench isolation in a semiconductor substrate includes depositing a silicon nitride comprising layer over a bulk semiconductor substrate. A photoresist comprising masking layer is formed over the silicon nitride comprising layer. The photoresist comprising masking layer is patterned effective to form a plurality of shallow trench mask openings therethrough. The silicon nitride comprising layer is etched through the mask openings substantially selectively relative to the photoresist using an etching chemistry comprising ammonia and at least one fluorocarbon.

7 Claims, 2 Drawing Sheets

U.S. PATENT DOCUMENTS

| | | | |
|---|---|---|---|
| 5,156,881 A | 10/1992 | Okano et al. | 427/572 |
| 5,182,221 A | 1/1993 | Sato | 437/67 |
| 5,286,344 A * | 2/1994 | Blalock et al. | 156/657 |
| 5,410,176 A | 4/1995 | Liou et al. | 257/50 |
| 5,470,798 A | 11/1995 | Ouellet | 437/231 |
| 5,719,085 A | 2/1998 | Moon et al. | 438/424 |
| 5,741,740 A | 4/1998 | Jang et al. | 438/435 |
| 5,776,557 A | 7/1998 | Okano et al. | 427/579 |
| 5,786,039 A | 7/1998 | Brouquet | 427/578 |
| 5,801,083 A | 9/1998 | Yu et al. | 438/424 |
| 5,814,563 A * | 9/1998 | Ding et al. | 438/714 |
| 5,863,827 A | 1/1999 | Joyner | 438/425 |
| 5,883,006 A | 3/1999 | Iba | 438/712 |
| 5,888,880 A | 3/1999 | Gardner et al. | 438/424 |
| 5,895,253 A | 4/1999 | Akram | 438/424 |
| 5,904,540 A | 5/1999 | Sheng et al. | 438/427 |
| 5,930,645 A | 7/1999 | Lyons et al. | 438/424 |
| 5,943,585 A | 8/1999 | May et al. | 438/400 |
| 5,950,094 A | 9/1999 | Lin et al. | 438/409 |
| 5,960,299 A | 9/1999 | Yew et al. | 438/424 |
| 5,972,773 A | 10/1999 | Liu et al. | 438/424 |
| 5,989,987 A | 11/1999 | Kuo | 438/592 |
| 5,998,280 A | 12/1999 | Bergemont et al. | 438/425 |
| 6,030,881 A | 2/2000 | Papasouliotis et al. | 438/424 |
| 6,051,477 A | 4/2000 | Nam | 438/404 |
| 6,103,137 A | 8/2000 | Park | |
| 6,140,168 A * | 10/2000 | Tan et al. | 438/197 |
| 6,156,674 A | 12/2000 | Li et al. | 438/780 |
| 6,300,219 B1 | 10/2001 | Doan et al. | 438/424 |

OTHER PUBLICATIONS

Beekmann et al., *Sub–micron Gap Fill and In–Situ Planarisation Using Flowfill™ Technology*, Electrotech, Presented at ULSI Conference, Portland, Oregon (Oct. 1995).

Horie et al., *Kinetics and Methanism of the Reactions of $O(^3P)$ With $SiH_4$, $CH_3SiH_3$, $(CH_3)_2SiH_2$, and $(CH_3)_3SiH$*, 95 J. Phys. Chem. No. 95, pp. 4393–4400 (1991).

Joshi et al., *Plasma Deposited Organosilicon Hydride Network Polymers as Versatile Resists for Entirely Dry Mid–Deep UV Photolithography*, 1925 SPIE 709–720 (1993).

Kiermasz et al., *Planarization for Sub–Micron Devices Utilising a New Chemistry*, Electrotech, Presented at DUMIC Conference, California (Feb. 1995).

Matsuura et al., *A Highly Reliable Self–planarizing Low–k Intermetal Dielectric for Sub–quarter Micron Interconnects*, IEEE 785–788 (1997).

Matsuura et al., *Novel Self–planarizing CVD Oxide for Interlayer Dielectric Applications*, IEEE 117–120 (1994).

McClatchie et al., *Low Dielectric Constant Flowfill® Technology for IMD Applications*, 7 pages (pre–Aug. 1993).

Withnall et al., *Matrix Reactions of Methylsilanes and Oxygen Atoms*, 92 J. Phys. Chem., No. 3, pp. 594–602 (1988).

Smolinsky et al., *Reactive Ion Etching of Silicon Oxides with ammonia and Trifluoromethane. The Role of . . .* , J. Electrochem. Soc.: Solid–State Science and Technology, pp. 1036–1039 (May 1982).

* cited by examiner

US 6,897,120 B2

METHOD OF FORMING INTEGRATED CIRCUITRY AND METHOD OF FORMING SHALLOW TRENCH ISOLATION IN A SEMICONDUCTOR SUBSTRATE

RELATED PATENT DATA

This application is a continuation-in-part of U.S. patent application Ser. No. 09/752,685, filed on Jan. 3, 2001, entitled "Method And Composition For Plasma Etching Of A Self-Aligned Contact Opening", listing Shane J. Trapp as the inventor. This earlier application is hereby fully incorporated by reference in this document as if presented in its entirety below.

TECHNICAL FIELD

This invention relates to methods of forming integrated circuitry, and to methods of forming shallow trench isolation in a semiconductor substrate.

BACKGROUND OF THE INVENTION

Semiconductor processing often involves the deposition of films or layers over or on a semiconductor substrate surface which may or may not have other layers already formed thereon. In typical circuitry fabrication, portions of an outer layer are masked, typically using photoresist, to provide a desired pattern over the outer layer. An underlying layer is then removed by chemical etching through the mask opening, with the mask covering and protecting other areas from the etching. Often it is desirable to etch an outer layer or layers selectively relative to an underlying layer. Accordingly, materials on the substrate, etch chemistry and conditions are continually being developed and improved to achieve a manner by which the desired layer(s) can be etched while stopping and substantially not etching an underlying layer.

Another concern is selectivity in the etch relative to the typical overlying photoresist masking layer used to form the pattern in underlying layers. For example, certain etching chemistries utilized to etch underlying layers can provide less than desired selectivity to the photoresist layer itself. In some instances, the removal rate of the photoresist can be so great as to require undesired thicker layers of photoresist to assure that the mask pattern formed in the photoresist remains for the complete etch of the underlying layer(s). In other instances, reduced or less than desired selectivity in using certain etching chemistries can cause a reduction in the anisotropy of the etch or otherwise rounding and widening of the pattern openings themselves. This can result in less than a desired accurate transfer of the mask pattern to the underlying layer(s). Accordingly, there is a continuing effort to improve etching chemistries that increase selectivity to photoresist in the etching of underlying layers, particularly where the underlying layers include silicon nitride.

Although the invention was particularly motivated from this perspective, it is in no way so limited, with the invention being limited only by the accompanying claims as literally worded and as interpreted in accordance with the doctrine of equivalents.

SUMMARY

The invention includes methods of forming integrated circuitry and methods of forming shallow trench isolation in a semiconductor substrate. In one implementation, a method of forming integrated circuitry includes forming a silicon nitride comprising layer over a semiconductor substrate. At least a portion of the silicon nitride comprising layer is etched using an etching chemistry comprising ammonia and at least one fluorocarbon. In one implementation, a method of forming shallow trench isolation in a semiconductor substrate includes depositing a silicon nitride comprising layer over a bulk semiconductor substrate. A photoresist comprising masking layer is formed over the silicon nitride comprising layer. The photoresist comprising masking layer is patterned effective to form a plurality of shallow trench mask openings therethrough. The silicon nitride comprising layer is etched through the mask openings substantially selectively relative to the photoresist using an etching chemistry comprising ammonia and at least one fluorocarbon.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

The invention is described in a first preferred embodiment in connection with FIGS. 1–6 in a preferred implementation of forming shallow trench isolation regions in a semiconductor substrate. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. Also in the context of this document, the term "layer" encompasses both the singular and the plural unless otherwise indicated.

Figure 1:
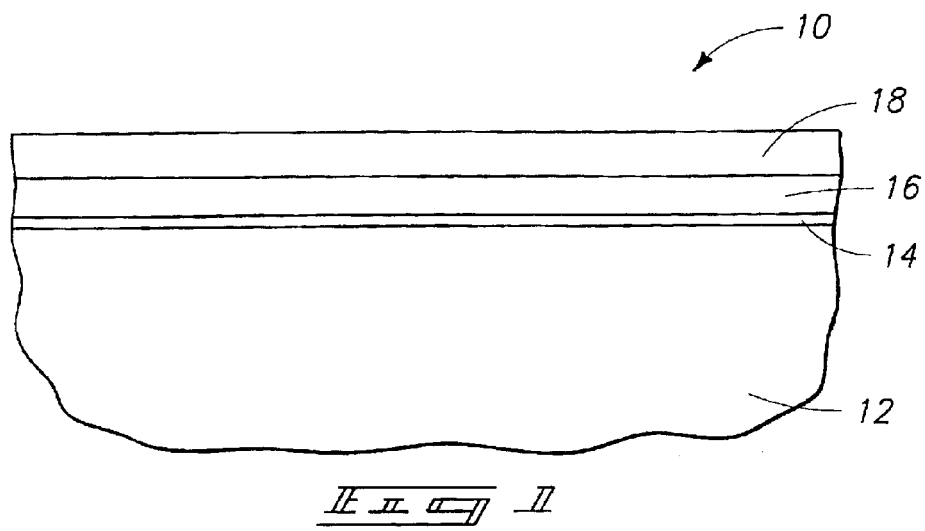
FIG. 1 is a diagrammatic sectional view of a semiconductor wafer fragment in process in accordance with an aspect of the invention.

FIG. 1 depicts a wafer fragment 10 comprised of a bulk monocrystalline silicon substrate 12. A pad oxide layer 14 is formed thereover, and a silicon nitride comprising layer 16 is formed over substrate 14/12. An exemplary thickness range for layer 14 is from 50 Angstroms to 100 Angstroms, while an exemplary thickness range for layer 16 is from 400 Angstroms to 1200 Angstroms. In one embodiment, layer 16 preferably consists essentially of silicon nitride, preferably deposited by chemical vapor deposition or other existing or yet-to-be-developed techniques. A photoresist comprising masking layer 18 is formed over and preferably on (in contact with) silicon nitride comprising layer 16. An exemplary thickness for layer 18 is from 2000 Angstroms to 8000 Angstroms. The invention may have particular utility to 193 nanometer photoresist which can be less resistant to certain etch chemistries as compared to other photoresists.

Figure 2:
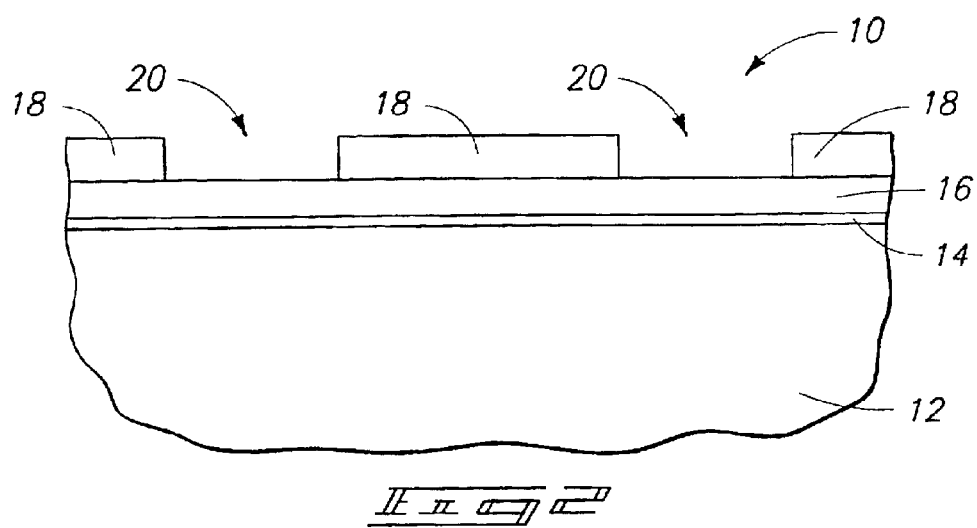
FIG. 2 is a view of the FIG. 1 wafer fragment at a processing step subsequent to that shown by FIG. 1.

Referring to FIG. 2, photoresist comprising layer 18 has been patterned effective to form a plurality of shallow trench mask openings 20 therethrough and to silicon nitride comprising layer 16. Conventional photolithography or other lithographic or nonlithographic methods, whether existing or yet-to-be-developed, are of course contemplated.

Figure 3:
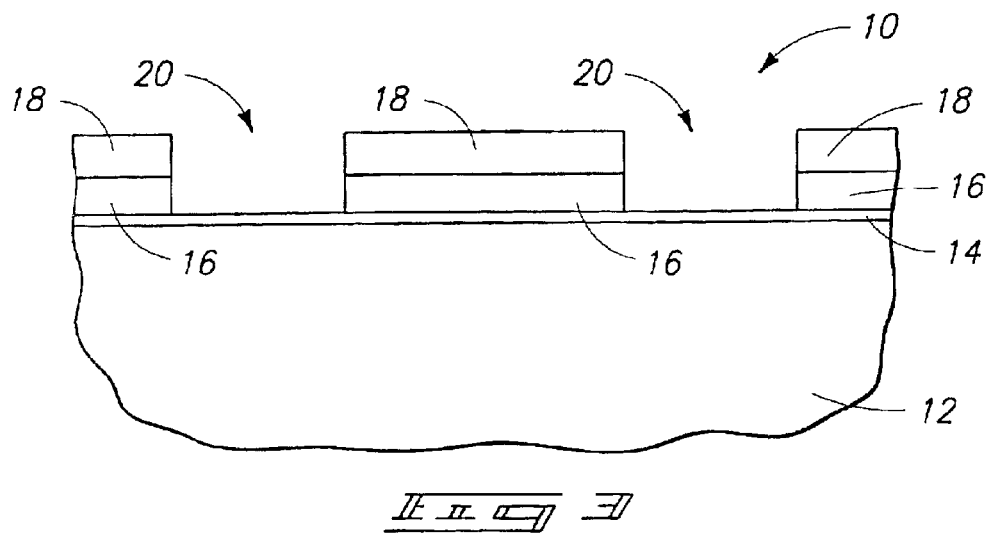
FIG. 3 is a view of the FIG. 1 wafer fragment at a processing step subsequent to that shown by FIG. 2.

Referring to FIG. 3, silicon nitride comprising layer 16 is etched through mask openings 20 using an etching chemistry comprising ammonia and at least one fluorocarbon. Preferably, such etching is plasma-enhanced using such chemistry and etching conditions to effectively substantially anisotropically etch silicon nitride comprising layer 16, and to do so substantially selectively relative to photoresist comprising layer 18. In the context of this document, "substantially selectively" means an etch ratio to a photoresist comprising layer of at least 2:1. Further in the context of this document, "substantially anisotropically" means an etch which achieves a wall angle which is within 10° to an angle normal to a mean outer surface of substrate 10. Further preferably, the etching conditions and ammonia quantity are chosen to be effective to provide increased selectivity to the photoresist comprising masking layer than would otherwise occur using an identical etching chemistry and identical etching conditions without any ammonia.

Preferably, at least two or more fluorocarbons are utilized, and in some embodiments at least three or more may be used as part of the invention. Fluorocarbon(s) may be chosen from those available in the art for plasma etching, as well as yet-to-be-developed fluorocarbons. Exemplary suitable fluorocarbons include at least one member selected from the group consisting of fluorinated carbons, hydrofluorocarbons, chlorofluorocarbons and chlorohydrocarbons. Non-limiting examples include such compounds as $C_4F_8$, $C_4F_6$, $C_5F_8$, $CF_4$, $C_2F_6$, $C_3F_8$, $CHF_3$, and $CH_2F_2$. Preferably, one or more of the compounds $CF_4$, $CHF_3$, and $CH_2F_2$ are utilized.

The fluorocarbon(s) are introduced with ammonia ($NH_3$) in any suitable reaction chamber. Preferably, the chamber is any suitable reaction vessel available for preferred plasma etching, including the remote generation of plasma outside of the actual reaction chamber. The ammonia may be obtained from any suitable source. The reaction chamber may be a multi-substrate chamber or a single substrate processor. By way of example only, the reaction chamber pedestal/susceptor for a single substrate processor may be set at an operating temperature within a range of about −50° C. to about 80° C., with about 0° C. to 80° C. being preferred. Preferred operating pressures are within the range of about 5 mTorr to about 200 mTorr, with a more preferred range being from about 30 mTorr to about 60 mTorr, with 45 mTorr being a particularly desirable example. Reduction-to-practice occurred at 100 mTorr. An exemplary preferred power range is from 250 to 1500 watts, with a preferred and reduction-to-practice example being 600 watts. Plasma etching may or may not be magnetically enhanced, with an exemplary magnetic field being from 0 to 200G. Reduction-to-practice examples occurred at 80G.

The etching chemistry preferably comprises a volumetric ratio of all fluorocarbon to the ammonia of from 40:1 to 2:1, more preferably from 40:1 to 3:1, and even more preferably from 40:1 to 4:1. Further preferably, the etching chemistry comprises a volumetric ratio of all fluorocarbon to the ammonia of at least 20:1. Further preferably, the etching chemistry comprises a volumetric ratio of all fluorocarbon to ammonia of no less than 6:1, and more preferably of no less than 9:1. A reduction-to-practice example utilized an Applied Materials 5000 Etch Chamber, with a $CF_4$ flow of 50 sccm, a $CHF_3$ flow of 20 sccm and an ammonia flow of 5 sccm. The ammonia flow rate is preferably kept at or below 8 sccm.

One or more of the fluorocarbons and the ammonia may be introduced into the reaction chamber substantially simultaneously, or successively. Other etching gases can, of course, be introduced into the reaction chamber together with the foregoing ammonia and fluorocarbon(s), with examples being carrier gasses, oxygen, nitrogen and other compounds.

Figure 4:
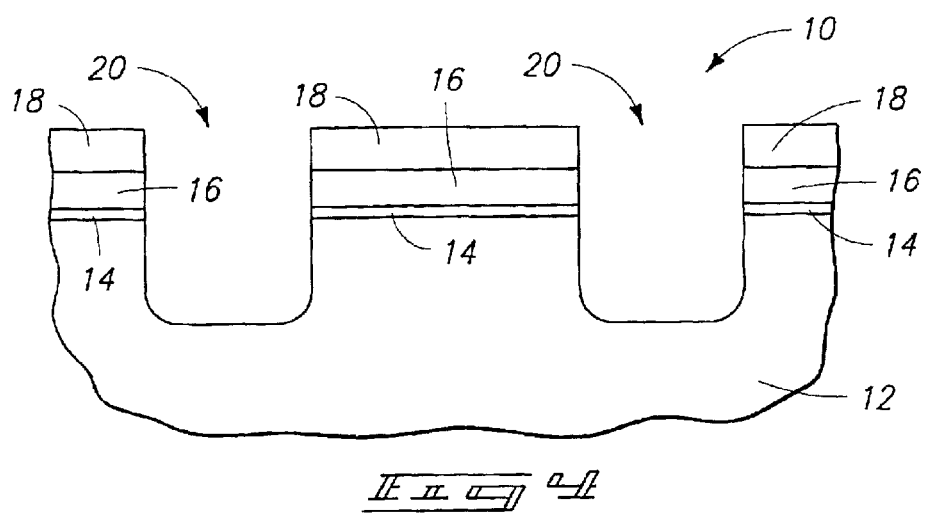
FIG. 4 is a view of the FIG. 1 wafer fragment at a processing step subsequent to that shown by FIG. 3.

Referring to FIG. 4, etching is conducted to continue the formation of shallow trench isolation openings 20 through pad oxide comprising layer 14 and into bulk semiconductor substrate material 12. The same or alternate existing or yet-to-be-developed chemistries could be utilized in continuing the etching to produce the FIG. 4 preferred embodiment construction.

Figure 5:
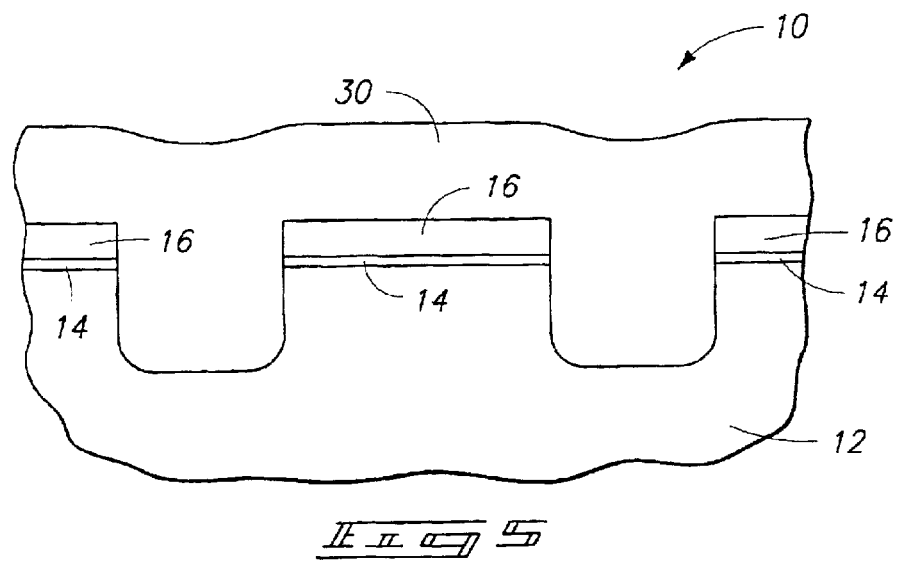
FIG. 5 is a view of the FIG. 1 wafer fragment at a processing step subsequent to that shown by FIG. 4.

Referring to FIG. 5, photoresist comprising layer 18 has been removed and an insulative material 30 has been deposited to completely fill the trench openings. Other processing, for example thermal sidewall oxidation, could be conducted prior or subsequent to the formation of layer 30. An exemplary process for forming layer 30 is by high density plasma deposition.

Figure 6:
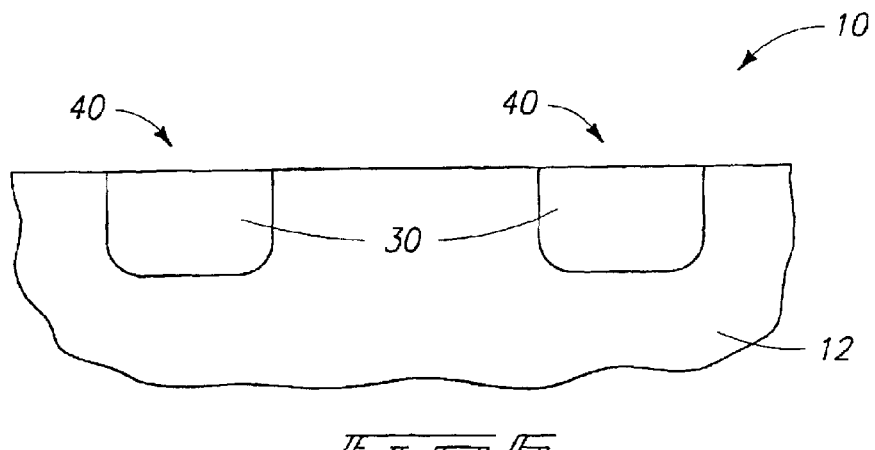
FIG. 6 is a view of the FIG. 1 wafer fragment at a processing step subsequent to that shown by FIG. 5.

Referring to FIG. 6, materials 30, 16 and 14 have been planarized back to form shallow trench isolation regions 40 within substrate material 12. Chemical mechanical polishing is an exemplary preferred method.

Alternate circuitry fabrication is also of course contemplated. In the broadest considered aspect of the invention, such is considered to literally include the formation of any silicon nitride comprising layer over any semiconductor substrate. At least a portion of the silicon nitride comprising layer is etched using an etching chemistry comprising ammonia and at least one fluorocarbon. A photoresist or other masking layer may or may not be present, and improved selectivity to other materials may or may not exist by inclusion of the ammonia.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of forming integrated circuitry comprising:
   forming a layer of oxide material over a semiconductor substrate;
   forming a silicon nitride layer over the layer of oxide material;
   forming a patterned photoresist comprising masking layer over the silicon nitride layer, the patterned masking layer comprising mask openings therethrough; and
   etching an opening through the silicon nitride layer, through the layer of oxide material and into a semiconductive material of the semiconductor substrate, the etching occurring through the mask openings substantially selectively to the photoresist comprising layer using a single etching chemistry produced by generating a plasma from a processing gas consisting of ammonia and at least one fluorocarbon selected from the group consisting of $CF_4$, $C_4F_8$, $C_4F_8$, $C_2F_6$, $C_3F_8$, $C_6F_8$, and chlorofluorocarbons, the etching being conducted under etching conditions effective to substantially anisotropically etch the silicon nitride comprising layer, the etching chemistry comprising a volumetric ratio of all fluorocarbon to the ammonia of from 40:1 to 20:1 and providing increased selectivity to the photoresist comprising masking layer than would otherwise occur using identical etching chemistry and identical etching conditions without any ammonia.

2. The method of claim 1 wherein the etching comprises magnetically enhanced plasma etching.

3. The method of claim 1 wherein the etching chemistry comprises at least two fluorocarbons.

4. The method of claim 1 wherein the etching chemistry comprises at least three fluorocarbons.

5. The method of claim 1 wherein the photoresist comprises 193 nanometer photoresist.

6. The method of claim 1 comprising introducing the ammonia and fluorocarbon successively into a reaction chamber in which the substrate is received during the etching and generating the plasma within the reaction chamber.

7. The method of claim 1 wherein the integrated circuitry forming comprises forming shallow trench isolation within the semiconductor substrate, the photoresist comprising masking layer being patterned effective to form a plurality of shallow trench mask openings therethrough.

* * * * *

UNITED STATES PATENT AND TRADEMARK OFFICE
CERTIFICATE OF CORRECTION

PATENT NO.   : 6,897,120 B2
DATED        : May 24, 2005
INVENTOR(S)  : Trapp

It is certified that error appears in the above-identified patent and that said Letters Patent is hereby corrected as shown below:

Column 5,
Lines 6-7, replace "$CF_4$, $C_4F_8$, $C_4F_8$, $C_2F_6$, $C_3F_8$, $C_6F_8$" with -- $CF_4$, $C_4F_6$, $C_4F_8$, $C_2F_6$, $C_3F_8$, $C_5F_8$ --.

Signed and Sealed this

Twenty-ninth Day of November, 2005

JON W. DUDAS
*Director of the United States Patent and Trademark Office*